(12) United States Patent
Chen

(10) Patent No.: US 10,256,244 B1
(45) Date of Patent: Apr. 9, 2019

(54) NAND FLASH MEMORY WITH FAST PROGRAMMING FUNCTION

(71) Applicant: SHINE BRIGHT TECHNOLOGY LIMITED, Hongkong (CN)

(72) Inventor: Minyi Chen, San Jose, CA (US)

(73) Assignee: GigaDevice Semiconductor (Beijing) Inc., Beijing (CN)

( * ) Notice: Subject to any disclaimer, the term of this patent is extended or adjusted under 35 U.S.C. 154(b) by 0 days.

(21) Appl. No.: 15/871,181

(22) Filed: Jan. 15, 2018

(51) Int. Cl.
  *G11C 16/04* (2006.01)
  *H01L 27/11524* (2017.01)
  *G11C 14/00* (2006.01)

(52) U.S. Cl.
  CPC ........ *H01L 27/11524* (2013.01); *G11C 14/00* (2013.01); *G11C 16/0441* (2013.01)

(58) Field of Classification Search
  CPC .... G11C 16/0483; G11C 16/10; H01L 27/115
  See application file for complete search history.

(56) References Cited

U.S. PATENT DOCUMENTS

| | | | |
|---|---|---|---|
| 2012/0020155 A1* | 1/2012 | Kim | G11C 11/5628 365/185.03 |
| 2016/0148691 A1* | 5/2016 | Rabkin | G11C 16/10 365/185.19 |
| 2017/0117037 A1* | 4/2017 | Mokhlesi | G11C 11/5628 |

* cited by examiner

*Primary Examiner* — Uyen B Tran
(74) *Attorney, Agent, or Firm* — Gokalp Bayramoglu

(57) ABSTRACT

A NAND flash memory including a plurality of levels of cells and a plurality of bitlines. Each bitline corresponds to a plurality of program states, the program states include an Erase-state, a highest state and a plurality of middle states, wherein the bitline voltages of the middle states during programming are between the bitline voltage of the Erase-state and the bitline voltage of the highest state during programming, and the bitline voltages of the middle states during programming are different from each other. The bitline program voltages of middle states of a NAND flash memory are controlled, thus a higher initial programming voltage of wordlines can be set without causing over-programming on the middle states of the bitlines. Therefore, program time is saved, and the programming speed is increased to achieve a fast program function.

3 Claims, 2 Drawing Sheets

| Program procedure | Program Inhibit | Slow Program Area (SPA) | Not pass program verify |
|---|---|---|---|
| bitline voltage during program | ~2.0V | ~1.0V | 0V |

*Example: bitline voltage during program (Assume: DVA=0.5V; DVB=0.4V)*

| program loop | erase-state (prohibit program) | A-state (DVA * program loop) | B-state (DVA * program loop - DVB) | C-state |
|---|---|---|---|---|
| 0 | ~2V | DVA*0 = 0V | DVA*0 - DVB = 0V | 0V |
| 1 | ~2V | 0.5V | 0.1V | 0V |
| 2 | ~2V | 1.0V | 0.6V | 0V |
| 3 | ~2V | 1.5V | 1.1V | 0V |
| 4 | ~2V | 2.0V | 1.6V | 0V |
| 5 | ~2V | 2.0V | 2.0V | 0V |

NAND FLASH MEMORY WITH FAST PROGRAMMING FUNCTION

TECHNICAL FIELD

The present application generally relates to the NAND flash memory technical field and, more particularly, to a NAND flash memory with fast programming function.

BACKGROUND OF THE INVENTION

Flash memory is an electronic (solid-state) non-volatile computer storage medium that can be electrically erased and reprogrammed. The NAND flash memory is a main type of flash memory named after the NAND logic gates, it has advantages of fast programming and short erasing time.

According to the number of levels, the NAND flash memories are divided into SLC flash memory (single-level cell), MLC memory (multi-level cell), TLC (triple-level cell) and QLC (quad-level cell). In the SLC flash memory, a unit may store one bit data while in the MLC flash memory, a unit may store two bits' data, and in the TLC flash memory a unit may store three bits' data.

When programming a flash unit, a voltage is applied to the control gate and an electric field is generated. Electrons passes through oxide of silicon barrier to achieve the floating gate due to the electric field. After passing, voltage applied to the control gate falls to zero. When erasing a flash unit, the voltage is applied to the silicon substrate.

SLC, MLC and TLC flash memories have the same MOSFET. The difference lies in, the SLC flash memory only has a program state and a non-program state, which are 0 and 1. A MLC flash memory unit stores two bits, thus it has four states 00, 01, 10 and 11. Each state corresponds a program voltage. A TLC flash memory unit stores three bits, thus it has eight states which are 000, 001, 010, 100, 011, 101, 110 and 111. To a QLC flash memory, there are more states which is not listed.

To the MLC, TLC and QLC NAND flash memories, the read margin of each state is very close. To take the MLC flash memory as an example, the 11 state is the Erase-state, 01 state is represented by A-state, 00 state is represented by B-state and 10 state is represented by C-state. During programming, the Erase-state bitlines are forced to be 2 volts while other states (A/B/C-state) bitlines are forced to be 0 volts.

To avoid over-programming, the initial program voltage (VPGM) of wordline of a NAND flash memory cannot be set too high, which is usually 12 volts. If the initial program goes beyond 12 volts, such as reaching 13 volts, the A and B states of bitline may be over-programmed. Therefore the program performance is lowered.

SUMMARY OF THE INVENTION

As an improvement, there is provided a NAND flash memory with fast programming function, which may overcome or at least partially solve or mitigate above problems.

To solve the problem above, an aspect of the present invention discloses a NAND flash memory, wherein the NAND flash memory comprises a plurality of levels of cells, the NAND flash memory comprising: a plurality of bitlines, each bitline corresponds to a plurality of program states, the program states include an Erase-state, a highest state and a plurality of middle states, wherein the bitline voltages of the middle states during programming are between the bitline voltage of the Erase-state and the bitline voltage of the highest state during programming, and the bitline voltages of the middle states during programming are different from each other.

In an embodiment, the NAND flash memory is a multi-level cell (MLC) flash memory, and the bitline voltage of the highest state during programming is 0 volt.

In an embodiment, the program states includes two middle states of A-state and B-state, wherein the bitline voltage of A-state during programming is calculated by the formula of:

$$VBL=DVA*\text{program loop};$$

wherein DVA and program loop are parameters preset in factory test.

In an embodiment, the bitline voltage of B-state during programming is calculated by the formula of:

$$VBL=DVA*\text{program loop}-DVB;$$

wherein DVB is a fixed value preset in factory test.

In an embodiment, the NAND flash memory is a triple-level cell (TLC) flash memory or a quad-level cell (QLC) flash memory.

As stated above, the invention provides a NAND flash memory with a fast programming function. Compared with the conventional technology, the invention controls bitline program voltages of middle states of a NAND flash memory, thus can set higher initial programming voltage of wordlines without causing over-programming on the middle states of the bitline. Therefore, program time is saved, and the programming speed is increased to achieve a fast program function.

The above description is merely an overview of technical solutions of the present application. In order to more clearly understand the technical solutions of the present application to implement in accordance with the contents of the description, and to make the foregoing and other objects, features and advantages of the application more apparent, detailed embodiments of the application will be provided below.

BRIEF DESCRIPTION OF THE DRAWINGS

Through reading the detailed description of the following preferred embodiments, various other advantages and benefits will become apparent to those of ordinary skills in the art. Accompanying drawings are merely included for the purpose of illustrating the preferred embodiments and should not be considered as limiting of the application. Further, throughout the drawings, like elements are indicated by like reference numbers.

DETAILED DESCRIPTION OF THE INVENTION

Exemplary embodiments of the present application will be described in detail with reference to the accompanying drawings hereinafter.

Figures 1, 2:
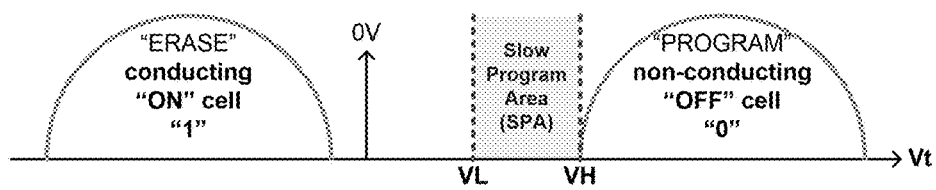
FIG. 1 is a schematic diagram showing the threshold voltage distribution of a NAND flash memory according to an embodiment of the present invention.
FIG. 2 is a diagram showing the bitline voltage of each state in programming.

FIG. 1 is a schematic diagram showing the voltage distribution of a NAND flash memory according to an embodiment of the present invention. As shown in FIG. 1, in the erase state, the memory cell stores 1, and in the program state, the memory cell stores 0. Between the erase state and the program state, a voltage range between VL and VH is a slow program area (SPA).

FIG. 2 is a schematic diagram showing the bitline voltage in each state corresponding to FIG. 1. As shown in FIG. 2, the bitline voltage level is controlled by a bitline driver, such as the NAND internal circuit for driving the bitline. The bitline voltages are divided into three ranges by the SPA. In the first level below the SPA, the bitline voltage VBL is 0 volt. In the second level within the SPA, the bitline voltage VBL equals to the bitline voltage of SPA, which may be 1.0 volt. In the level above the VH (program verify target level), the bitline voltage may be 2.0 volts. The level above VH is an inhibit bitline area in which bitline cannot be programmed.

Figures 3, 4:
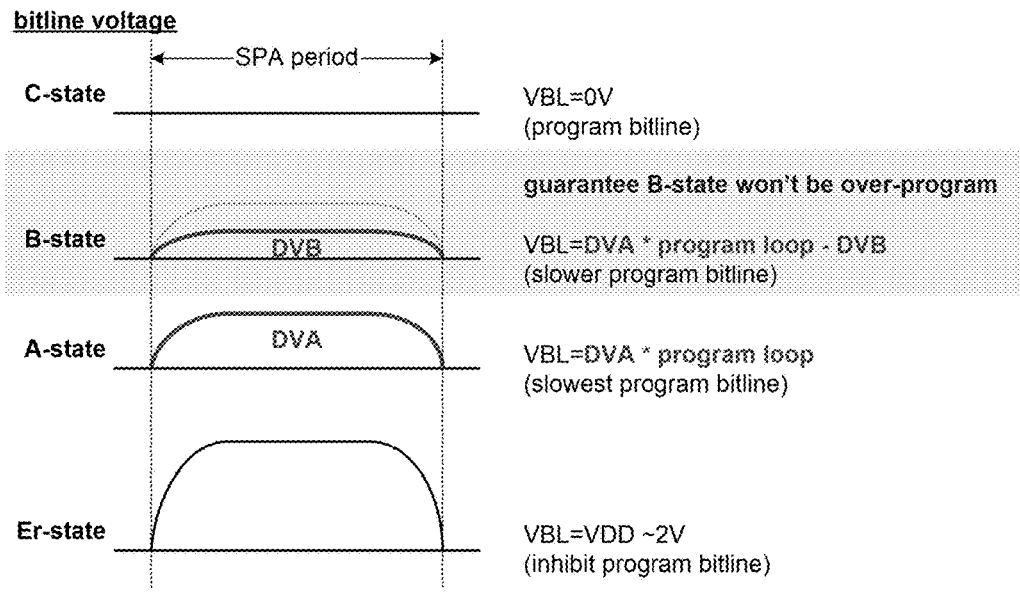
FIG. 3 is a schematic diagram showing the bitline voltages of each state of the MLC NAND flash memory.
FIG. 4 is a diagram showing an example of the bitline voltages control.

FIG. 3 is a schematic diagram showing the bitline voltages of each state of the MLC NAND flash memory. As shown in FIG. 3, and with reference to FIG. 2, in the Erase-state, the bitline voltage VBL equals to VDD such as 2.0 volts, which is the voltage provided by the power source.

In A-state, the bitline voltage VBL during programming is calculated by the formula of:

$$VBL=DVA*\text{program loop}$$

Wherein DVA is A-state level bitline program voltage, and program loop varies from 0 to N.

In practical application, the parameter of DVA may be given by manufactures, and the bitline voltages VBL in A-state may be obtained according to the parameter DVA and program loop.

In B-state, the bitline voltage VBL during programming is calculated by the formula of:

$$VBL=DVA*\text{program loop}-DVB.$$

Wherein DVB is delta voltage for B-state, and it may be set as a fixed value to guarantee B-state won't be over-programmed. DVB can be fined tune by parameter, and both DVA and DVB are in the range of 1.0-2.0 volts.

FIG. 4 is a diagram showing an example of the bitline voltages control. As shown in FIG. 4, assuming DVA equals to 0.5 V and DVB equals to 0.4V, if program loop is determined, then the bitline voltage of A-state and the bitline voltage of B-state are obtained according to the diagram in FIG. 4.

In C-state, the bitline voltage VBL during programming may be set as zero.

Among the three states of A-state, B-state and C-state, A-state is programmed in the slowest speed, B-state is programmed faster than A-state, but slower than C-state.

As a skilled person should understand, the MLC flash memory and the C-state thereof are just taking as an example. The invention may also be applied to NAND flash memory with a plurality of levels of cells, such as a TLC (triple-level cell) and a QLC (quad-level cell).

The NAND flash memory includes a plurality of bitlines, each bitline corresponds to a plurality of program states, the program states include an Erase-state, a highest state and a plurality of middle states.

The highest state may be the C-state in MLC flash memory, the G-state in TLC flash memory and the 16LC-state in the QLC flash memory. The middle states may be the A-state and B-state of the MLC flash memory.

The bitline voltages of the middle states during programming are between the bitline voltage of the Erase-state and the bitline voltage of the highest state during programming, and the bitline voltages of the middle states during programming are different from each other.

As stated above, the NAND flash memory according to the embodiment of the present disclosure may not be used in MLC flash memory, but may be used in NAND flash memory includes a plurality of levels of cells, such as TLC (triple-level cell) and QLC (quad-level cell) et, al, which is not illustrated thereto.

As stated above, the invention provides a NAND flash memory with a fast programming function. Compared with the conventional technology, the invention controls bitline program voltages of middle states of a NAND flash memory, thus can set higher initial programming voltage of word-lines, therefore over-programming of middle states is avoided, and program time is saved, and the programming speed is increased to achieve a fast program function.

Preferably, the initial programming voltage of wordlines may be set between 12 volts to 13 volts, since the A-state and B-state of the bitline of the MLC flash memory are located in the slow program area, the A-state and B-state will not be over-programmed. As the initial programming voltage of wordlines are rised, the program speed is increased, and fast program function is achieved.

Many details are discussed in the specification provided herein. However, it should be understood that the embodiments of the disclosure may be implemented without these specific details. In some examples, the well-known methods, structures and technologies are not shown in detail so as to avoid an unclear understanding of the description.

It should be noted that the above-described embodiments are intended to illustrate but not to limit the present application, and alternative embodiments may be devised by the person skilled in the art without departing from the scope of claims as appended. In the claims, any reference symbols between brackets form no limit of the claims. The wording "include" does not exclude the presence of elements or steps not listed in a claim. The wording "a" or "an" in front of an element does not exclude the presence of a plurality of such elements. The disclosure may be realized by means of hardware comprising a number of different components and by means of a suitably programmed computer. In the unit claim listing a plurality of devices, some of these devices may be embodied in the same hardware. The wordings "first", "second", and "third", etc. do not denote any order. These wordings may be interpreted as a name.

Also, it should be noticed that the language used in the present specification is chosen for the purpose of readability and teaching, rather than explaining or defining the subject matter of the present application. Therefore, it is obvious for an ordinary skilled person in the art that modifications and variations could be made without departing from the scope and spirit of the claims as appended. For the scope of the present application, the publication of the inventive disclosure is illustrative rather than restrictive, and the scope of the present application is defined by the appended claims.

What is claimed is:

1. A NAND flash memory, comprising:
   a plurality of levels of cells;
   a plurality of bitlines, wherein each bitline corresponds to
      a plurality of program states, the program states include
      an Erase-state, a highest state and a plurality of middle
      states, wherein bitline voltages of the middle states
      during programming are between a bitline voltage of
      the Erase-state and a bitline voltage of the highest state
      during programming, and the bitline voltages of the
      middle states during programming are different from
      each other;

wherein the NAND flash memory is a multi-level cell (MLC) flash memory, and the bitline voltage of the highest state during programming is 0 volt;

wherein the plurality of middle states include an A-state and a B-state, the bitline voltage of the A-state during programming is calculated by the formula $VBL=DVA*\text{program loop}$;

wherein DVA and program loop are parameters preset in factory test.

2. The NAND flash memory according to claim 1, wherein the bitline voltage of the B-state during programming is calculated by the formula $VBL=DVA*\text{program loop}-DVB$;

wherein DVB is a fixed value preset in factory test.

3. The NAND flash memory according to claim 1, wherein the NAND flash memory is a triple-level cell (TLC) flash memory or a quad-level cell (QLC) flash memory.

* * * * *